(12) United States Patent
Fujiwara et al.

(10) Patent No.: US 10,955,498 B2
(45) Date of Patent: Mar. 23, 2021

(54) DNP-NMR PROBE AND METHOD OF USING THE SAME

(71) Applicants: Osaka University, Suita (JP); JEOL Ltd., Tokyo (JP)

(72) Inventors: Toshimichi Fujiwara, Suita (JP); Yoh Matsuki, Suita (JP); Hiroki Takahashi, Tokyo (JP); Shinji Nakamura, Tokyo (JP)

(73) Assignees: JEOL Ltd., Tokyo (JP); Osaka University, Suita (JP)

( * ) Notice: Subject to any disclaimer, the term of this patent is extended or adjusted under 35 U.S.C. 154(b) by 51 days.

(21) Appl. No.: 16/580,205

(22) Filed: Sep. 24, 2019

(65) Prior Publication Data

US 2020/0103478 A1 Apr. 2, 2020

(30) Foreign Application Priority Data

Sep. 28, 2018 (JP) .............................. JP2018-184185

(51) Int. Cl.
*G01R 33/34* (2006.01)
*G01R 33/30* (2006.01)

(52) U.S. Cl.
CPC ........... *G01R 33/34* (2013.01); *G01R 33/307* (2013.01)

(58) Field of Classification Search
CPC .............................. G01R 33/34; G01R 33/307
See application file for complete search history.

(56) References Cited

U.S. PATENT DOCUMENTS

| 4,674,513 A | 6/1987 | Jasper, Jr. |
| 9,739,862 B2 | 8/2017 | Wilhelm et al. |

(Continued)

FOREIGN PATENT DOCUMENTS

| JP | 2016142537 A | 8/2016 |
| WO | 2017175180 A1 | 10/2017 |
| WO | 2018050527 A1 | 3/2018 |

OTHER PUBLICATIONS

Matsuki et al., Helium-cooling and spinning dynamic nuclear polarization for sensitivity-enhanced solid-state NMR at 14 T and 30 K, Journal of Magnetic Resonance, 2012, pp. 1-9. No. 225.

(Continued)

*Primary Examiner* — G. M. A Hyder
(74) *Attorney, Agent, or Firm* — The Webb Law Firm

(57) ABSTRACT

Attenuation of microwaves is reduced or prevented when vacuum windows are provided in microwave waveguides of a DNP-NMR probe. A DNP-NMR probe has an inner container and an outer container. The inner container has therein a sample tube containing a sample to which radicals are added. The outer container keeps a space between the outer container and the inner container in the outer container in a vacuum state. The outer container has an outer container waveguide that has a vacuum window at an inner end portion and guides microwaves. The inner container has a vacuum window facing the vacuum window of the outer container waveguide through vacuum, and guides microwaves transmitted from the outer container waveguide to the sample. The window-to-window distance between the vacuum window of the outer container and the vacuum window of the inner container is adjusted by means of adjustment bolts.

8 Claims, 14 Drawing Sheets

(56) References Cited

U.S. PATENT DOCUMENTS

2016/0223628 A1* 8/2016 Fujiwara .............. G01R 33/307
2019/0212256 A1   7/2019 Joch et al.

OTHER PUBLICATIONS

Extended European Search Report issued in EP19199794.9 dated Feb. 19, 2020.
Office Action issued in Japanese Patent Application No. 2018-184185 dated Sep. 17, 2020.
Matsuki et al.; DNP at High-Fields and Low-Temperatures for High-Sensitivity Biological Solid-State NMR; Mar. 21, 2017; Institute for Protein Res. et al.

* cited by examiner

| TRANSMITTANCE OF ONE VACUUM WINDOW | | SILICON NITRIDE | ALUMINA | BOROSILICATE GLASS | TEFLON |
|---|---|---|---|---|---|
| MICROWAVES 460 GHz | CYCLE OF WINDOW THICKNESS (mm) | 0.11 | 0.10 | 0.14 | 0.23 |
| | GLOBAL MAXIMUM VALUE OF TRANSMITTANCE | 0.97 | 0.92 | 0.56 | 1.0 |
| | GLOBAL MINIMUM VALUE OF TRANSMITTANCE | 0.63 | 0.59 | 0.52 | 0.95 |
| | INDEX OF REFRACTION | 2.96 | 3.26 | 2.33 | 1.4 |
| MICROWAVES 395 GHz | CYCLE OF WINDOW THICKNESS (mm) | 0.14 | 0.12 | 0.17 | 0.27 |
| | GLOBAL MAXIMUM VALUE OF TRANSMITTANCE | 0.97 | 0.92 | 0.63 | 1.0 |
| | GLOBAL MINIMUM VALUE OF TRANSMITTANCE | 0.63 | 0.59 | 0.57 | 0.95 |
| | INDEX OF REFRACTION | 2.71 | 3.16 | 2.23 | 1.41 |

Transmittance of two vacuum windows (microwaves 460 GHz)

| Parameter | Silicon Nitride | Alumina | Borosilicate Glass | Teflon |
|---|---|---|---|---|
| Window thickness | 1.70 mm | 1.60 mm | 1.65 mm | 2.20 mm |
| Cycle of window-to-window distance (mm) | 0.33 | 0.33 | 0.33 | 0.33 |
| Transmittance of one window | 0.65 | 0.6 | 0.54 | 0.95 |
| Global maximum value of transmittance | 0.75 | 0.65 | 0.32 | 1.0 |
| Convergence value of two windows | 0.25 | 0.17 | 0.24 | 0.90 |
| Global minimum value of transmittance | 0.423 | 0.36 | 0.29 | 0.82 |
| Window thickness | 1.75 mm | 1.65 mm | 1.70 mm | 2.10 mm |
| Cycle of window-to-window distance (mm) | 0.33 | 0.33 | 0.33 | 0.33 |
| Transmittance of one window | 0.97 | 0.92 | 0.56 | 1.0 |
| Global maximum value of transmittance | 0.98 | 0.9 | 0.35 | 1.0 |
| Convergence value of two windows | 0.9 | 0.8 | 0.28 | 1.0 |
| Global minimum value of transmittance | 0.941 | 0.85 | 0.31 | 0.97 |

# DNP-NMR PROBE AND METHOD OF USING THE SAME

CROSS-REFERENCE TO RELATED APPLICATION

This application claims priority to Japanese Patent Application No. 2018-184185 filed Sep. 28, 2018, the disclosure of which is hereby incorporated by reference in its entirety.

BACKGROUND OF THE INVENTION

Field of the Invention

The present disclosure relates to a DNP-NMR probe and to a method of using the same.

Description of Related Art

A nuclear magnetic resonance (NMR) measurement apparatus is an apparatus for measuring a sample at the atomic level utilizing the NMR phenomenon in which atomic nuclei placed in a static magnetic field interact with electromagnetic waves of a specific frequency. In the NMR measurement apparatus, an NMR probe including a container containing the sample is placed in the static magnetic field generated by a superconducting magnet or the like. The container of the NMR probe has an electric circuit called an NMR circuit, and the NMR circuit emits radio waves to the sample and detects NMR signals from the sample.

Dynamic nuclear polarization (DNP) is known as a method for increasing the NMR signal intensity. In an NMR measurement apparatus based on the DNP method (referred to as a DNP-NMR measurement apparatus), a substance with unpaired electrons (radicals) is added to the sample, and microwaves for exciting electron spin resonance are emitted to that mixture. Thus, the large spin polarization of unpaired electrons is transferred to nuclear spin polarization, thereby increasing the NMR signal intensity by a factor of about 1,000.

The NMR signal intensity obtained by the DNP-NMR measurement apparatus largely depends on magnetic relaxation of radicals added to the sample. If the relaxation time of the radicals is short, radical magnetization is attenuated before the nuclear spin polarization increases, resulting in a smaller degree of increase in NMR signal intensity. The relaxation time of radicals is known to become longer with lower temperature. For example, at liquid nitrogen temperature or below (although the temperature depends on the pressure, at 1 atm, it is equal to or lower than the boiling point of liquid nitrogen of 77 K (−196° C.)), the relaxation time of radicals becomes almost equal to or longer than the magnetization transfer time between the electron spin and the nuclear spin, and a dramatic increase in the NMR signal intensity can be expected.

U.S. Pat. No. 9,739,862 B discloses provision of a waveguide linearly extending from a microwave generator to a sample to thereby enhance the irradiation efficiency of microwaves.

JP 2016-142537 A discloses a DNP-NMR measurement apparatus that uses, as cooling gas, helium gas of very low temperature (e.g. 20 K or less). In this apparatus, an inner container containing a sample to which radicals are added is installed inside an outer container, and a space between the inner container and the outer container is kept in a vacuum state to insulate the inner container. The outer container has a waveguide having a vacuum window on its inner container side, and the inner container has a waveguide having a vacuum window on its outer container side. The two vacuum windows face each other with the vacuum space in between without contacting each other. Microwaves propagating through the waveguide of the outer container are transmitted to the waveguide of the inner container through the two vacuum windows and then emitted to the mixture of the sample and the radicals.

SUMMARY OF THE INVENTION

In order to enhance vacuum insulation of the inner container and then transmit microwaves, it is necessary to provide vacuum windows in waveguides, as disclosed in JP 2016-142537 A. However, when the vacuum windows are provided in the waveguides, there is concern that the microwave transmittance is reduced by the vacuum windows, resulting in reduction in the DNP efficiency.

An object of the present disclosure is to reduce or prevent attenuation of microwaves when vacuum windows are provided in microwave waveguides in a DNP-NMR probe.

A DNP-NMR probe according to an embodiment of the present disclosure has an inner container in which a sample to which a radical is added is installed, an outer container that stores the inner container therein and keeps a space between the outer container and the inner container in a vacuum state, an outer container waveguide that is a microwave waveguide provided on the outer container and has a vacuum window at an end on the inner container side, and an inner container waveguide that is a microwave waveguide provided on the inner container and has a vacuum window facing the vacuum window of the outer container waveguide through vacuum, and the inner container waveguide guides microwaves transmitted from the outer container waveguide to the sample. The DNP-NMR probe is characterized in that the window thickness (D) or the window-to-window distance (L) of the vacuum window of the outer container and the vacuum window of the inner container is optimized for the transmittance of specific microwaves used.

According to the present disclosure, high NMR signal intensity can be obtained by increasing the transmittance of microwaves passing through the vacuum windows and improving the DNP efficiency.

BRIEF DESCRIPTION OF THE DRAWINGS

An embodiment of the present disclosure will be described based on the following figures, wherein:

FIG. 10 is a table summarizing the relationship between the window thickness and the transmittance of one window;

FIG. 11 is a table summarizing the relationship between the window thickness and the transmittance of two windows;

DESCRIPTION OF THE INVENTION

(A) Overview of Embodiment

Figure 1:
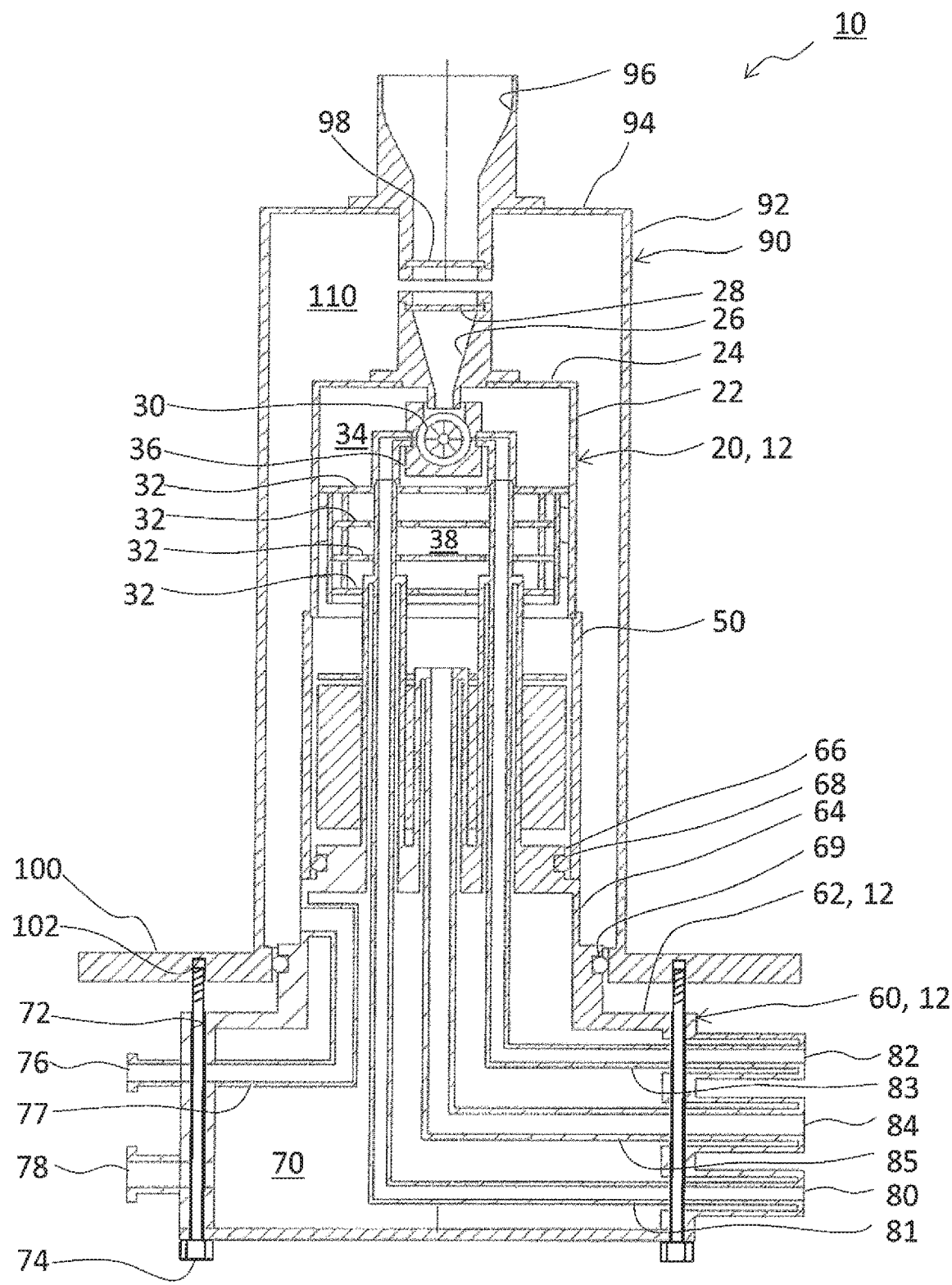
FIG. 1 is a diagram showing an apparatus structure of a DNP-NMR probe according to an embodiment.

A DNP-NMR probe according to an embodiment is an apparatus constituting a DNP-NMR measurement system that measures NMR signals by the DNP method. The DNP-NMR probe includes an inner container, an outer container, an outer container waveguide, and an inner container waveguide. The inner container includes therein a sample to which radicals are added. The outer container stores the inner container therein and keeps a space between the outer container and the inner container in a vacuum state. The outer container waveguide is a microwave waveguide provided on the outer container and has a vacuum window at its end on the inner container side. The inner container waveguide is a microwave waveguide provided on the inner container and has a vacuum window facing the vacuum window of the outer container waveguide through vacuum. The inner container waveguide receives microwaves transmitted from the outer container waveguide and emits, from the other end, microwaves to the sample to which the radicals are added. The window thickness or the window-to-window distance of the vacuum window of the outer container and the vacuum window of the inner container are optimized for the transmittance of specific microwaves used.

Here, "optimization" refers to an optimal state or a state in which adjustment has been made to achieve a state close to the optimal state. For example, when an appropriate window thickness range is obtained in terms of strength, durability, ease of manufacture, cost, etc., and when the window thickness having a higher microwave transmittance than an average value of the microwave transmittance over that range is adopted, it can be said that the window thickness is optimized. Similarly, when an approximate window-to-window distance range between the two vacuum windows is obtained, and when the window-to-window distance having a higher microwave transmittance than an average value of the microwave transmittance over that range is adopted, it can be said that the window-to-window distance is optimized. Optimization of one or both of the window thickness and the window-to-window distance for the transmittance enables an increase in the microwave transmittance and improve the DNP efficiency and the NMR signal intensity.

The DNP-NMR probe according to the embodiment is characterized in that the window-to-window distance L between the vacuum window of the outer container and the vacuum window of the inner container is set within the range of $L_0 - \Delta L/8 \leq L \leq L_0 + \Delta L/8$ for specific microwaves used, where $L_0$ is a window-to-window distance in which the microwave transmittance exhibits a local maximum when the window-to-window distance L is changed, and $\Delta L$ is a distance that provides a cycle in which the microwave transmittance changes when the window-to-window distance L is changed.

The DNP-NMR probe according to the embodiment is characterized in that it has an adjustment mechanism that adjusts the window-to-window distance between the vacuum window of the outer container and the vacuum window of the inner container. Adjustment of the distance between the vacuum windows enables a change (increase) in the microwave transmittance. The adjustment mechanism may be manually adjusted or automatically adjusted mechanically. The adjustment mechanism may adjust the window-to-window distance by, for example, making an adjustment of one or both of a position of the vacuum window in the outer container and a position of the vacuum window in the inner container. Alternatively, the adjustment mechanism may adjust the window-to-window distance between the vacuum windows provided in the outer container and the inner container by making an adjustment of one or both of positions of the outer container and the inner container.

The DNP-NMR probe according to the embodiment is characterized in that it has a moving mechanism that moves the inner container relative to the outer container, and in that the adjustment mechanism adjusts the window-to-window distance by adjusting the amount of movement of the moving mechanism. The moving mechanism may move the inner container while the outer container is fixed, move the outer container while the inner container is fixed, or move both of them. The moving mechanism includes, for example, a mechanism that causes movement by screw rotation and a mechanism that causes movement by insertion and extraction of a spacer.

The DNP-NMR probe according to the embodiment is characterized in that the window thickness of the vacuum window of the outer container Dout and the window thickness of the vacuum window of the inner container Din are respectively set within a range of $Dout_0 - \Delta Dout/8 \leq Dout \leq Dout_0 + \Delta Dout/8$ and a range of $Din_0 - \Delta Din/8 \leq Din \leq Din_0 + \Delta Din/8$ for the specific microwaves used, where $Dout_0$ and $Din_0$ are window thicknesses at which the microwave transmittance exhibits a local maximum when the respective window thicknesses Dout and Din are changed, and $\Delta Dout$ and $\Delta Din$ are distances that provide a cycle in which the microwave transmittance changes when the respective window thicknesses Dout and Din are changed.

The DNP-NMR probe according to the embodiment is characterized in that the vacuum window of the outer container and the vacuum window of the inner container are made of any one of ceramics, glass, single crystal, and resin materials. The vacuum window of the outer container and the vacuum window of the inner container may be made of the same material, or may be made of different materials.

The method of using the DNP-NMR probe according to the embodiment includes an optimization step of optimizing the window-to-window distance for the transmittance of specific microwaves used, by means of the adjustment mechanism. In the optimization step, for example, the window-to-window distance L is set within the range of $L_0-\Delta L/8 \leq L \leq L_0+\Delta L/8$ for microwaves of a specific frequency used.

(B) Details of Embodiment

Hereinafter, the embodiment will be described with reference to the drawings. Although, in the description, specific aspects will be described for ease of understanding, these aspects exemplify the embodiment, and various other embodiments are possible.

(B-1) Structure of Apparatus

FIG. 1 is a diagram showing a cross-sectional structure of a DNP-NMR probe 10 according to the embodiment. The DNP-NMR probe 10 is a probe used for measurement of a sample in a DNP-NMR measurement apparatus. The DNP-NMR probe 10 has an inner unit 12 including an inner container 20 and a lower unit 60, and an outer container 90.

The outer container 90 is a container formed in a cylindrical shape and serves to keep the inside of the container in a vacuum state. The upper end of a cylindrical-shaped side wall 92 is closed by a top wall 94. The top wall 94 has, at its center, an outer waveguide 96 which is an example of the outer container waveguide. The outer waveguide 96 is a cylindrical member made of, for example, copper and penetrates the top wall 94 from outside to inside. The outer waveguide 96 is hermetically fixed at the position where it penetrates the top wall 94 via a sealing member such as, for example, indium. The outer waveguide 96 has a vacuum window 98 hermetically attached to the inner circumferential surface near the tip portion of the outer waveguide 96. Materials having high microwave transmission properties and strength to withstand a pressure difference can be used as the vacuum window 98, and, for example, diamond, sapphire, silicon nitride, and the like are used. The lower end of the outer container 90 is open. The side wall 92 has a flange 100 extending outward on the outer circumferential surface at this lower end.

The inner container 20 of the inner unit 12 is a cylindrical container which is inserted into the outer container 90 from an opening at the lower end of the outer container 90. The inside of the inner container 20 is kept airtight. The inner container 20 has a cylindrical upper side wall 22 and lower side wall 50. The upper end of the upper side wall 22 is closed by a top wall 24. The upper side wall 22 and the top wall 24 are made of metal that can provide electromagnetic shielding, such as, for example, copper.

The upper wall 24 has, at its center, a cylindrical inner waveguide 26 that is an example of the inner container waveguide and is hermetically attached thereto so as to penetrate the upper wall. The inner waveguide 26 has a vacuum window 28 hermetically attached to the inner circumferential surface of the upper end portion of the inner waveguide 26. The vacuum window 28 faces the vacuum window 98 of the outer waveguide 96 with a small distance in between. For example, diamond, sapphire, silicon nitride, and the like are used as materials for the vacuum window 28. The lower end of the inner waveguide 26 faces a sample tube 30 stored in the inner container 20. The lower end of the upper side wall 22 is open.

The lower side wall 50 is formed of a resin, such as fiber reinforced plastic (FRP). The inner circumference of the upper end of the lower side wall 50 is hermetically adhered to the outer circumference of the lower end of the upper side wall 22. In addition, a sealing partition wall 66 of the lower unit 60 is inserted into the inner circumference of the lower end of the lower side wall 50. The sealing partition wall 66 is provided with an O-ring 68. This ensures airtightness between the inner container 20 and the lower unit 60.

The lower portion of the inner container 20 is coupled to the lower unit 60. The lower unit 60 has a box body 62 formed in a rectangular parallelepiped shape and a protruding portion 64 protruding from the upper center portion of the box body 62. The interior of the box body 62 and the interior of the protruding portion 64 communicate with each other and form a lower airtight chamber 70. The inside of the lower airtight chamber 70 is kept airtight independently of the inner container 20.

As described above, the sealing partition wall 66 is provided on the upper portion of the protruding portion 64 of the lower unit 60, and the O-ring 68 is provided inside the surface of the sealing partition wall 66. An O-ring 69 is also provided under the protruding portion 64. The O-ring 69 ensures airtightness between the lower unit 60 (and the inner unit 12) and the outer container 90.

The lower unit 60 has through holes 72 at the four corners of the box body 62. This through hole 72 receives an adjustment bolt 74 inserted from below. The tip of the adjustment bolt 74 is threaded. The flange 100 of the outer container 90 also has bolt holes 102 in the bottom surface (not penetrating through the upper surface), along the extension lines of the through holes 72. The inside of the bolt hole 102 is threaded. The tip of the adjustment bolt 74 is inserted into this bolt hole 102. The distance between the inner unit 12 including the lower unit 60 and the outer container 90 is changed by turning the adjustment bolts 74. As a result, the interval between the vacuum window 98 of the outer waveguide 96 and the vacuum window 28 of the inner waveguide 26 is adjusted. That is, the adjustment bolts 74 function as an adjustment mechanism that adjusts the distance between the vacuum windows 98 and 28.

The lower unit 60 has an upper vacuum port 76, a lower vacuum port 78, a bearing gas supply port 80, a drive gas supply port 82, and an exhaust port 84. The upper vacuum port 76 is connected to a vent pipe 77. The vent pipe 77 is communication with an upper airtight chamber 110. The upper airtight chamber 110 is a space which is formed between the inside of the outer container 90 and the upper outer circumferential side of the inner unit 12 and in which airtightness is ensured by the O-ring 68 and the O-ring 69. The upper vacuum port 76 has a depressurizing line, such as a vacuum pump (not shown), attached thereto, and the depressurizing line keeps the upper airtight chamber 110 in a vacuum state. Here, "vacuum" refers to a state in which the air is kept sufficiently thin compared to the atmosphere, and the required level of heat insulation is ensured. In the embodiment, the pressure is reduced to, for example, $10^{-3}$ Pa or less. However, even higher pressure than this, for example, even about 1 Pa, is assumed to be a vacuum, as long as it is the pressure reduced to the extent that necessary heat insulation is ensured.

The lower vacuum port 78 is in communication with the lower airtight chamber 70 formed in the lower unit 60. The lower vacuum port 78 has a depressurizing line, such as a vacuum pump (not shown), attached thereto, and the depressurizing line keeps the lower airtight chamber 70 in a vacuum state.

The bearing gas supply port 80 is connected to a bearing gas feed pipe 81. Further, the drive gas supply port 82 is connected to a drive gas feed pipe 83. Both the bearing gas feed pipe 81 and the drive gas feed pipe 83 communicate with the inside of the inner container 20. The bearing gas supply port 80 and the drive gas supply port 82 have cooling gas supply lines including pumps (not shown) attached thereto, and the cooling gas supply lines supply bearing gas and drive gas for the sample tube. Further, the exhaust port 84 is connected to a gas exhaust pipe 85. The gas exhaust pipe 85 communicates with the inside of the inner container 20 and exhausts cooling gas from the inner container 20.

In the inner container 20, the inside of the upper side wall 22 is partitioned by means of a plurality of partition walls 32 in a ventilated manner. The uppermost portion inside the upper side wall 22 is a sample chamber 34 in which the sample tube 30 is installed. The sample chamber 34 faces the top wall 24, and the sample tube 30 is installed at a position facing the lower end surface of the inner waveguide 26.

The sample tube 30 contains a mixture of a sample to be measured and radicals (substance having unpaired electrons) used in the DNP method. The sample tube 30 is installed in a gas bearing rotation mechanism 36 located in the sample chamber 34. The gas bearing rotation mechanism 36 is a device for rotating the sample tube 30 at high speed while inclining it at a predetermined angle (the so-called magic angle). The gas bearing rotation mechanism 36 is supplied with relatively high pressure cooling gas from the bearing gas feed pipe 81 and the drive gas feed pipe 83, and this cooling gas is used to provide a bearing for the sample tube 30 and drive the sample tube 30. Cooling gas is set at, for example, an extremely low temperature of 20 K or less and is also used to cool the inside of the inner container 20 including the sample tube 30.

The sample tube 30 is installed inside a transmitting and receiving coil. The transmitting and receiving coil is a part constituting an NMR circuit. Further, an electric circuit chamber 38 provided below the sample chamber 34 has therein, for example, a variable capacitor which is another electric circuit part constituting the NMR circuit. The NMR circuit is electrically connected to a spectrometer controller (not shown). The spectrometer controller is a device provided outside the DNP-NMR probe 10 and is composed of computer hardware and software for controlling the hardware. The spectrometer controller performs processing of generating radio waves in the NMR circuit, adjusting the timing of emission of the radio waves, amplifying signals detected by the transmitting and receiving coil to obtain a spectrum, and the like. The user operates dedicated software on a control PC (not shown) to thereby provide instructions to the spectrometer controller when necessary and obtain data from the spectrometer controller and display the data in a graph, for example.

(B-2) Operations of Apparatus

The operation of DNP-NMR probe 10 will now be described. First, the sample tube 30 is installed in the gas bearing rotation mechanism 36 in the sample chamber 34 in the DNP-NMR probe 10. The sample tube 30 contains a mixture of a sample to be measured and radicals. The sample tube 30 is also surrounded by the transmitting and receiving coil constituting the NMR circuit.

Next, the inner container 20 and the lower unit 60 are coupled. At this time, a space between the lower end of the inner circumference of the lower side wall 50 of the inner container 20 and the sealing partition wall 66 of the lower unit is sealed by the O-ring 68. This ensures airtightness inside the inner container 20.

The inner unit 12 in which the inner container 20 and the lower unit 60 are coupled is inserted into the outer container 90. At this time, a space between the lower end of the inner circumference of the side wall 92 of the outer container 90 and the inner unit 12 is sealed by the O-ring 69. As a result, airtightness is ensured in the upper airtight chamber 110.

The outer container 90 is fixed in a bore in a magnetic field generator (not shown) by bolting. The inner unit 12 inserted in this outer container 90 is fixed to the outer container 90 by means of the four adjustment bolts 74. These adjustment bolts 74 also serve as an adjustment mechanism that adjusts the distance between the vacuum windows 98 and 28. That is, by turning the adjustment bolts 74 in the tightening direction, the distance between the outer container 90 and the inner unit 12 becomes shorter, and at the same time, the distance between the vacuum windows 98 and 28 becomes shorter. In addition, by turning the adjustment bolts 74 in the loosening direction, the distance between the outer container 90 and the inner unit 12 becomes longer, and at the same time, the distance between the vacuum windows 98 and 28 becomes longer. The adjustment bolts 74 can fine-tune the distance by the rotation angle. For example, they can adjust the distance with an accuracy of 0.05 mm, an accuracy of 0.03 mm, or an accuracy of 0.01 mm. The DNP-NMR probe 10 may also have a mechanism for temporarily fixing the outer container 90 and the inner unit 12, in addition to the adjustment bolts 74. This mechanism prevents the inner unit 12 from falling from the outer container 90 without using the adjustment bolts 74. The mechanism also enables adjustment by means of the adjustment bolts 74 from a temporarily fixed position, thereby making the adjustment operation more efficient.

Next, the depressurizing lines at the upper vacuum port 76 and the lower vacuum port 78 are activated to evacuate the upper airtight chamber 110 and the lower airtight chamber 70. In addition, cooling gas is fed from the bearing gas supply port 80 into the inner container 20 through the bearing gas feed pipe 81. Cooling gas is also fed from the drive gas supply port 82 into the inner container 20 through the drive gas feed pipe 83. These cooling gases are used to provide a bearing for the sample tube 30 and rotate the sample tube 30 in the gas bearing rotation mechanism 36.

As the cooling gas, for example, helium gas cooled to an extremely low temperature of 20 K or less is used. The cooling gas cools the NMR circuit in the inner container 20 as well as the sample tube 30. The cooling gas is then exhausted via the gas exhaust pipe 85 and the exhaust port 84. JP 2016-142537 A discloses a structure for circulating the cooling gas.

In the magnetic field generator, a static magnetic field is formed by means of a superconducting magnet or the like. When the sample is placed in this static magnetic field, the nuclear spin is polarized. The spectrometer controller controls the NMR circuit to emit radio waves from the transmitting and receiving coil to the sample and receive NMR signals from the detected sample. The spectrometer controller performs, for example, processing of amplifying the obtained NMR signals to obtain a spectrum. The thus obtained data are transmitted to a computer (not shown) and are provided for data processing which is carried out according to the user's instructions. Thus, various types of information that constitute the sample (for example, information of nuclear magnetic interaction) can be obtained.

In the DNP-NMR probe 10 based on the DNP method, microwaves are emitted to the sample tube 30 in this process of obtaining the NMR signals. Specifically, a microwave generator generates microwaves and transmits them to the outer waveguide 96. Microwaves guided to the outer waveguide 96 pass through the vacuum window 98 and the vacuum space in the upper airtight chamber 110 and are then transmitted to the inner waveguide 26 through the vacuum window 28 facing the vacuum window 98. The other end of the inner waveguide 26 is directed to the sample tube 30, and the microwaves are thus emitted to the sample tube 30. Irradiation of the sample tube 30 with the microwaves excites electron spin resonance of radicals. Because the sample tube 30 is cooled by cooling gas to an extremely low temperature, and the relaxation time of the radicals is long, electron spin polarization is sufficiently transferred to nuclear spin polarization of the sample, thereby increasing the NMR signal intensity.

(B-3) Transmission of Microwaves

Next, transmission of microwaves will be described. The DNP-NMR probe 10 shown in FIG. 1 is usually used in a specific magnetic field generator. The static magnetic field intensity which acts on the sample tube 30 is therefore fixed. This magnitude of the static magnetic field determines the frequency (energy) at which electron spin resonance of radicals occurs. Accordingly, in the DNP-NMR probe 10, the frequency of microwaves used is fixed.

Figure 2:
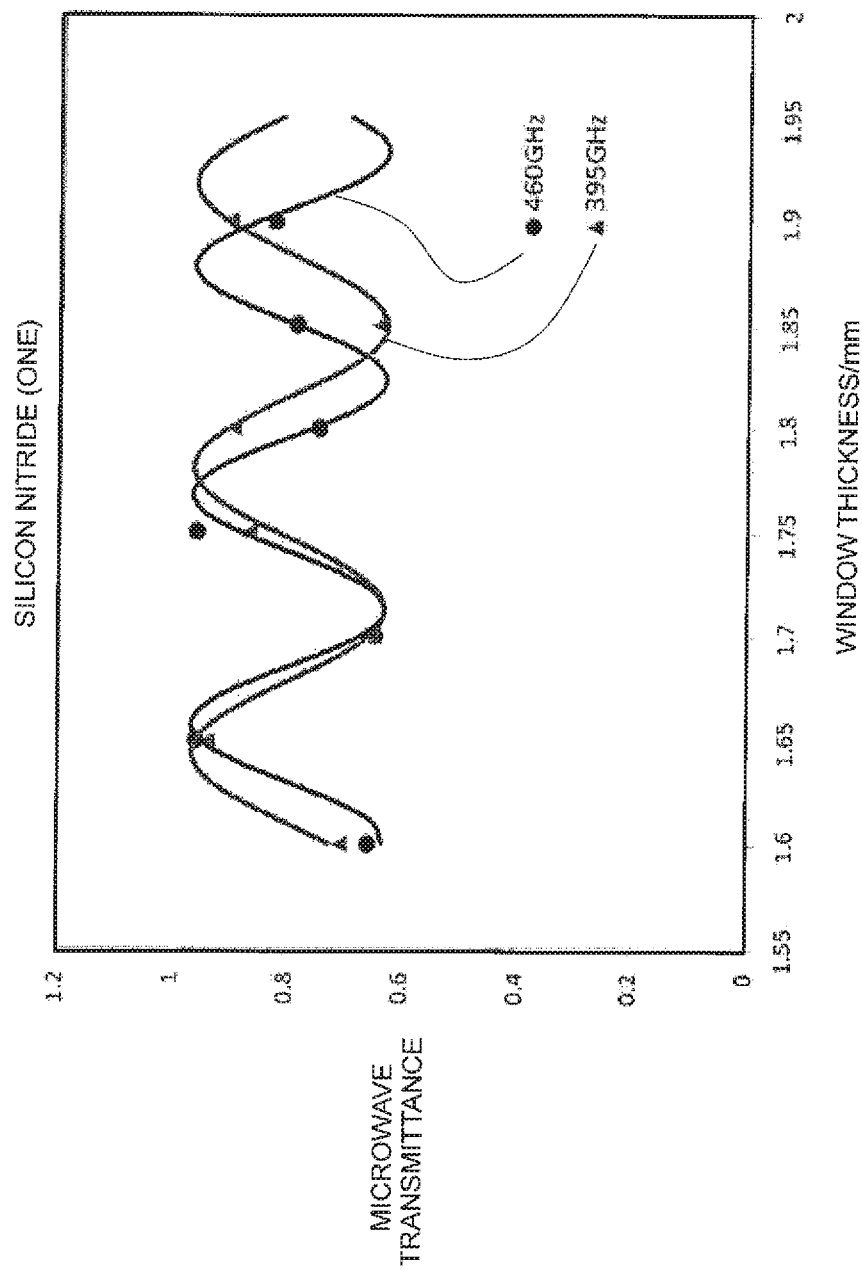
FIG. 2 is a diagram showing the relationship between the window thickness and the transmittance of one silicon nitride window.

FIG. 2 is a diagram showing the laboratory measurement results for the relationship between the thickness (window thickness) of a silicon nitride plate which is a candidate member for the vacuum windows 98 and 28 and the microwave transmittance. The experiments were carried out in seven cases in which the window thickness of the vacuum window is changed in 0.05 mm increments from 1.6 mm to 1.9 mm for microwaves of 460 GHz and 395 GHz. Sine curves approximating the experimental results are also shown. Although the sine curves include a portion deviating from the experimental values, they can approximate the experimental values with high accuracy as a whole.

Referring to the sine curve of a microwave frequency of 460 GHz, when the window thickness is about 1.66 mm, the microwave transmittance exhibits a local maximum value (and a global maximum value) of about 0.97. The transmittance has a cycle of about 0.11 mm with respect to the window thickness. That is, the transmittance reaches a local maximum value every time the window thickness is increased by about 0.11 mm. The microwave transmittance also reaches a local minimum value (and a global minimum value) of about 0.63 at the intermediate point between the local maximum values.

Meanwhile, for the sine curve of a microwave frequency of 395 GHz, when the window thickness is about 1.64 mm, the microwave transmittance has a local maximum value (and a global maximum value) of about 0.97. The transmittance has a cycle of about 0.14 mm with respect to the window thickness. The microwave transmittance also has a local minimum value (and a global minimum value) of about 0.63.

From these experimental results, it is understood that each microwave has a window thickness at which the transmittance can be increased, and that that window thickness changes periodically. When the window thickness is appropriate, the transmittance is high (nearly 1). However, when the window thickness is inappropriate, the transmittance is low (about 0.63), and microwaves that can be transmitted decrease (to ⅔ or less in the example of FIG. 2).

Figure 3:
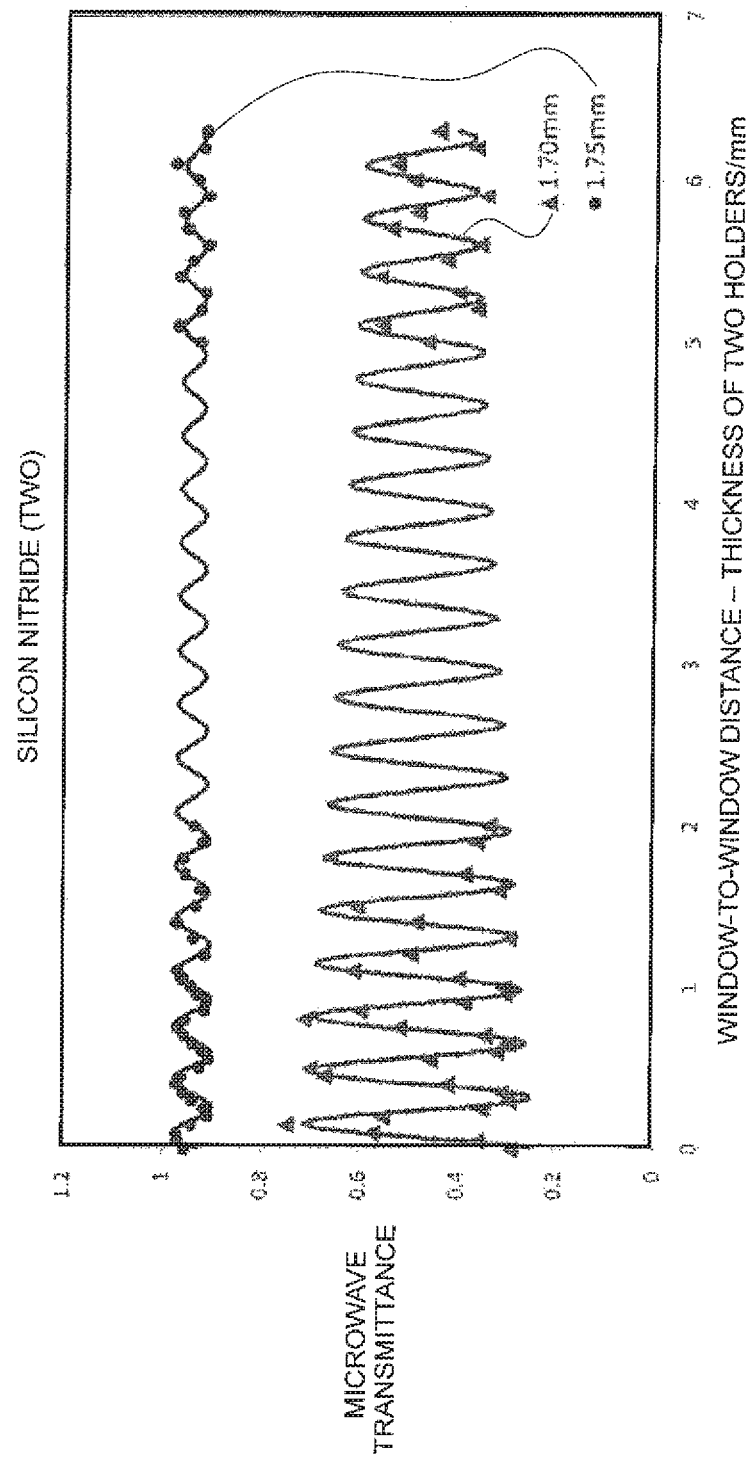
FIG. 3 is a diagram showing the relationship between the window-to-window distance and the transmittance of two silicon nitride windows.

FIG. 3 is a diagram showing the results of the experiments in which two silicon nitride vacuum windows whose transmittances are shown in FIG. 2 are arranged close to each other, and microwaves are transmitted through them. In FIG. 3 (and FIG. 5, FIG. 7, and FIG. 9), the horizontal axis indicates "the window-to-window distance–the thickness of two holders", and the vertical axis indicates "the transmittance of microwaves (after transmission through the second window)", and the relationship between them is shown in a graph. The horizontal axis is thus set because, in the experiments, two vacuum windows were fixed by means of holders, and the distance between the holders was measured. The holder-to-holder distance and the window-to-window distance have the relationship of "the holder-to-holder distance=the window-to-window distance–the thickness of two holders". The thickness of two holders is about 2 mm in total. It should be noted that, in the following description, simply "the window-to-window distance" may be used in cases where the thickness of the holder is not important.

The experiments were carried out by setting the window thickness of both of the two vacuum windows at 1.70 mm and setting the window thickness of both of the two vacuum windows at 1.75 mm. The microwave frequency was set at 460 GHz in both cases. FIG. 3 shows points indicating the experimental values and an attenuating sine curve approximating the results. Although, in these experiments, the experimental values and the approximation curves vary somewhat largely at some points, the approximation curves approximate the experimental values accurately as a whole. When the window thickness was 1.70 mm, the microwave transmittance changed finely with the window-to-window distance. This change was caused in a window-to-window distance cycle of about 0.33 mm. The amplitude of the transmittance increased as the window-to-window distance was shorter. Specifically, when the window-to-window distance–the thickness of two holders was about 0 mm, a local minimum value (and a global minimum value) of about 0.25 was obtained (however, there was an error between the measured value and the approximation curve). When the window-to-window distance–the thickness of two holders was about 0.16 mm, a local maximum value (and a global maximum value) of about 0.75 was obtained. In addition, when the window-to-window distance–the thickness of two holders was about 6.1 mm, a local maximum value of about 0.6 was obtained. When the window-to-window distance–the thickness of two holders was about 6.25 mm, a local minimum value of about 0.38 was obtained.

When one vacuum window having a window thickness of 1.70 mm was used, the transmittance of microwaves of 460 GHz was about 0.65 as shown in FIG. 2 (though there is an error between the measured value and the approximation curve). On the other hand, when two vacuum windows that were the same as the one vacuum window were used, the transmittance had a value greater than that obtained when one window was used, as long as the window-to-window distance was appropriate. Specifically, when the window-to-window distance–the thickness of two holders was smaller than about 2.5, a local maximum value of about 0.65 to 0.75 was obtained. Further, compared to the product of the microwave transmittances obtained when one vacuum window was used (0.65×0.65=0.423 which is considered as a convergence value obtained when the window-to-window distance becomes long enough), the microwave transmittance obtained when two vacuum windows were used was always higher on the local maximum value side independently of the window-to-window distance and was always lower on the minimum value side independently of the window-to-window distance. Accordingly, there were cases, depending on the window-to-window distance, where the microwave transmittance of the two vacuum windows was (a) lower than the product of the transmittances of the one vacuum window (convergence value in the case of two vacuum windows), (b) higher than the product of the transmittances of the one vacuum window (convergence value in the case of the two vacuum windows) but lower than the transmittance of the one vacuum window, and (c) higher than the transmittance of the one vacuum window.

As shown in FIG. 3, also, when the window thickness was 1.75 mm, the microwave transmittance oscillated according to the window-to-window distance. The cycle was about 0.33 mm, which was almost the same as that when the window thickness was 1.70 mm. In addition, the microwave transmittance had a global maximum value of about 0.98 and a global minimum value of about 0.9.

On the other hand, when one vacuum window having a window thickness of 1.75 mm was used, the measured value of the microwave transmittance was about 0.97, as shown in FIG. 2. Further, the product of the microwave transmittances of the one vacuum window was 0.97×0.97=0.941 (as described above, this is a convergence value obtained when the window-to-window distance between the two windows becomes long enough). Therefore, like the case where the window thickness was 1.70 mm, it can be said that, depending on the window-to-window distance, the microwave transmittance of two vacuum windows indicates the above three patterns (a), (b), and (c) (however, in FIG. 2, there are large errors between the measured value and the approximation curve, and the effect of those errors therefore needs to be sufficiently taken into account).

Like the case of silicon nitride, the experimental results of alumina, borosilicate glass, and Teflon (registered trademark) (polytetrafluoroethylene) which are other candidate members for the vacuum windows 98 and 28 are respectively shown in FIGS. 4 and 5, FIGS. 6 and 7, and FIGS. 8 and 9.

Figure 4:
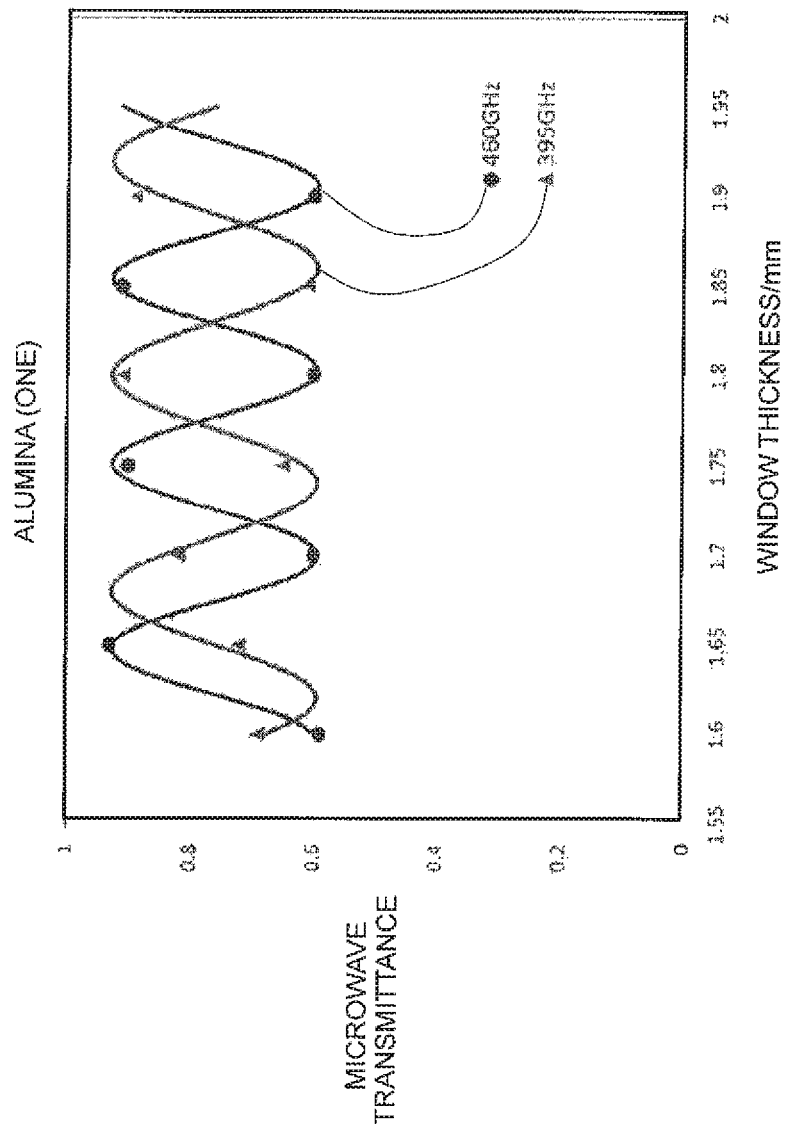
FIG. 4 is a diagram showing the relationship between the window thickness and the transmittance of one alumina window.

When one alumina vacuum window was used as shown in FIG. 4, and when the microwave frequency was 460 GHz, a window thickness cycle of about 0.10 mm, a global maximum value in microwave transmittance of about 0.92, and a global minimum value in microwave transmittance of about 0.59 were obtained. Further, when the microwave frequency was 395 GHz, a window thickness cycle of about 0.12 mm, a global maximum value in microwave transmittance of about 0.92, and a global minimum value in microwave transmittance of about 0.59 were obtained.

Figure 5:
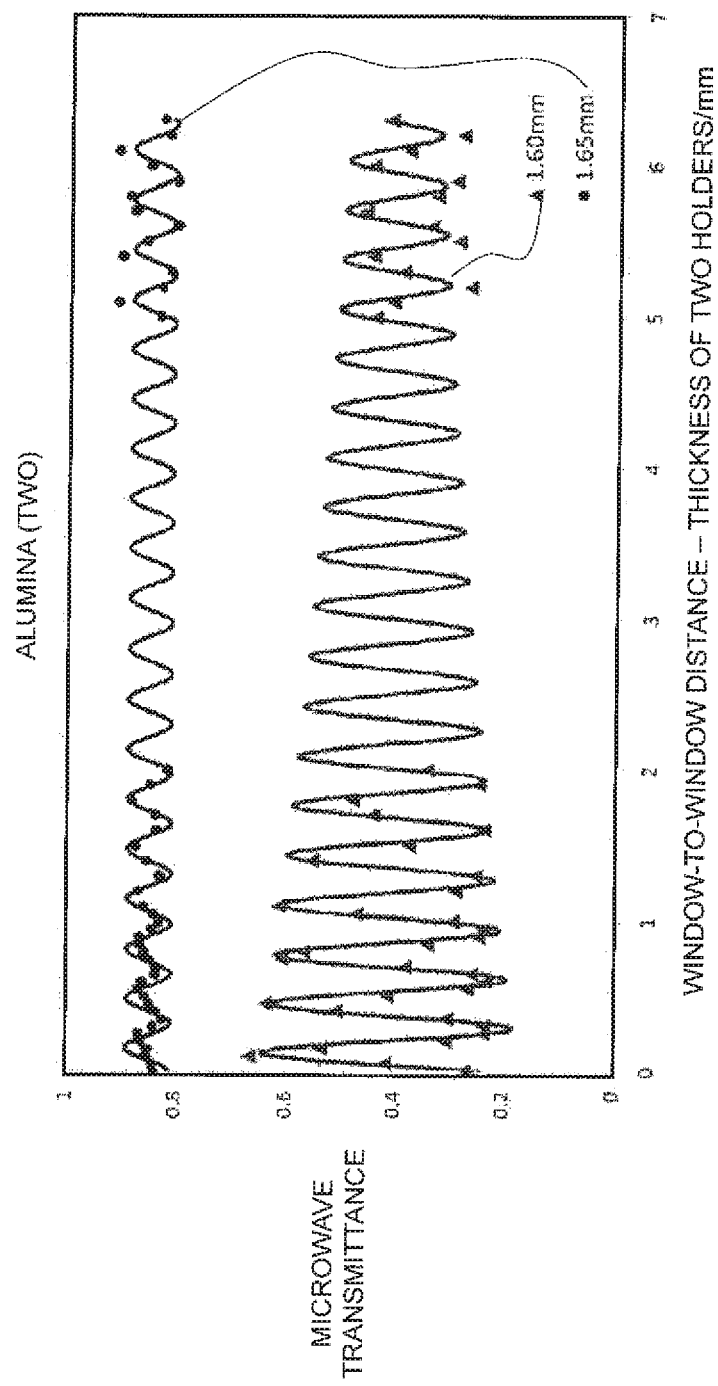
FIG. 5 is a diagram showing the relationship between the window-to-window distance and the transmittance of two alumina windows.

FIG. 5 shows the microwave transmittances at a microwave frequency of 460 GHz when two alumina vacuum windows both had the window thickness of 1.60 mm and when two alumina vacuum windows both had the window thickness of 1.65 mm. When the window thickness of the vacuum window was 1.60 mm, a window-to-window distance cycle of about 0.33 mm, a global maximum value in microwave transmittance of about 0.65, and a global minimum value in microwave transmittance of about 0.17 were obtained. In addition, for one alumina vacuum window having a window thickness of 1.60 mm, the transmittance was about 0.6 as shown in FIG. 4. For two alumina vacuum windows both having a window thickness of 1.60 mm, the convergence value was 0.6×0.6=0.36. Therefore, the above three patterns (a), (b), and (c) were observed.

When the window thickness of the alumina vacuum window was 1.65 mm, a window-to-window distance cycle of about 0.33 mm, a global maximum value in microwave transmittance of about 0.9, and a global minimum value in microwave transmittance of about 0.8 were obtained. In addition, for one alumina vacuum window having a window thickness of 1.65 mm, the transmittance was about 0.92 as shown in FIG. 4. For two alumina vacuum windows both having a window thickness of 1.65 mm, the convergence value was about 0.85. Therefore, the above two patterns (a) and (b) were observed.

Figure 6:
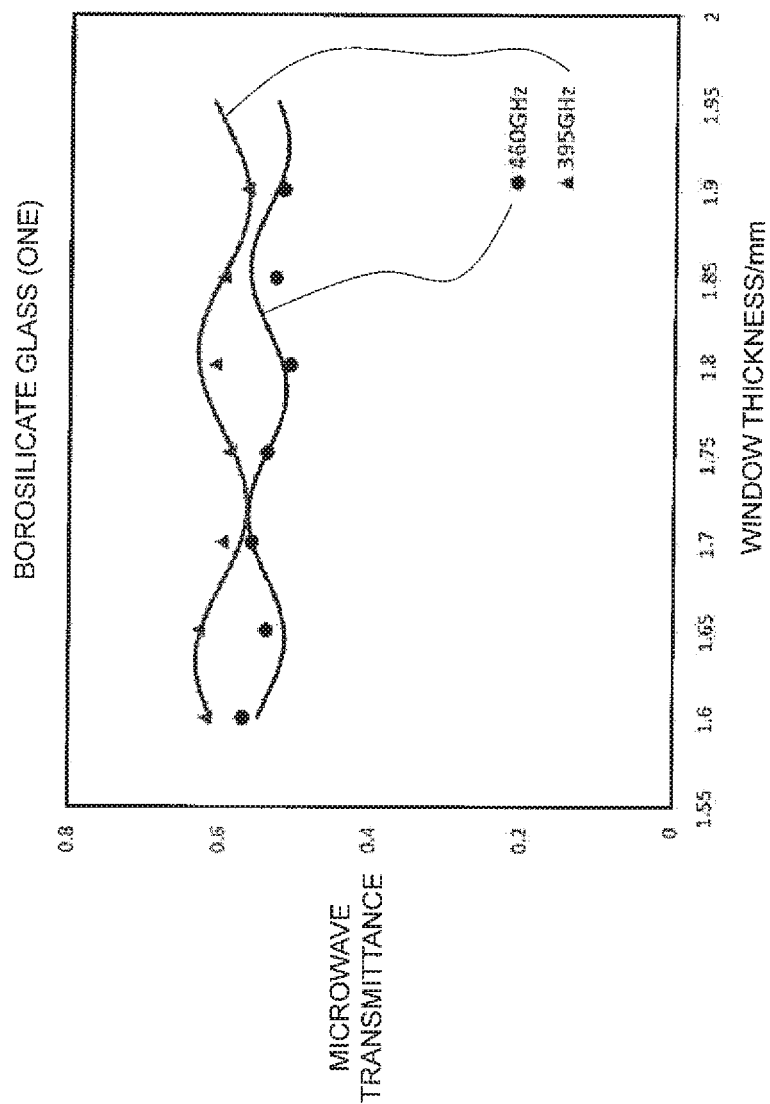
FIG. 6 is a diagram showing the relationship between the window thickness and the transmittance of one borosilicate glass window.

When one borosilicate glass vacuum window was used as shown in FIG. 6, and when the microwave frequency was 460 GHz, a window thickness cycle of about 0.14 mm, a global maximum value in microwave transmittance of about 0.56, and a global minimum value in microwave transmittance of about 0.52 were obtained. Further, when the microwave frequency was 395 GHz, a window thickness cycle of about 0.17 mm, a global maximum value in microwave transmittance of about 0.63, and a global minimum value in microwave transmittance of about 0.57 were obtained. Borosilicate glass has higher dielectric loss as compared to the other members in the present embodiment, and it therefore has a lower transmittance.

Figure 7:
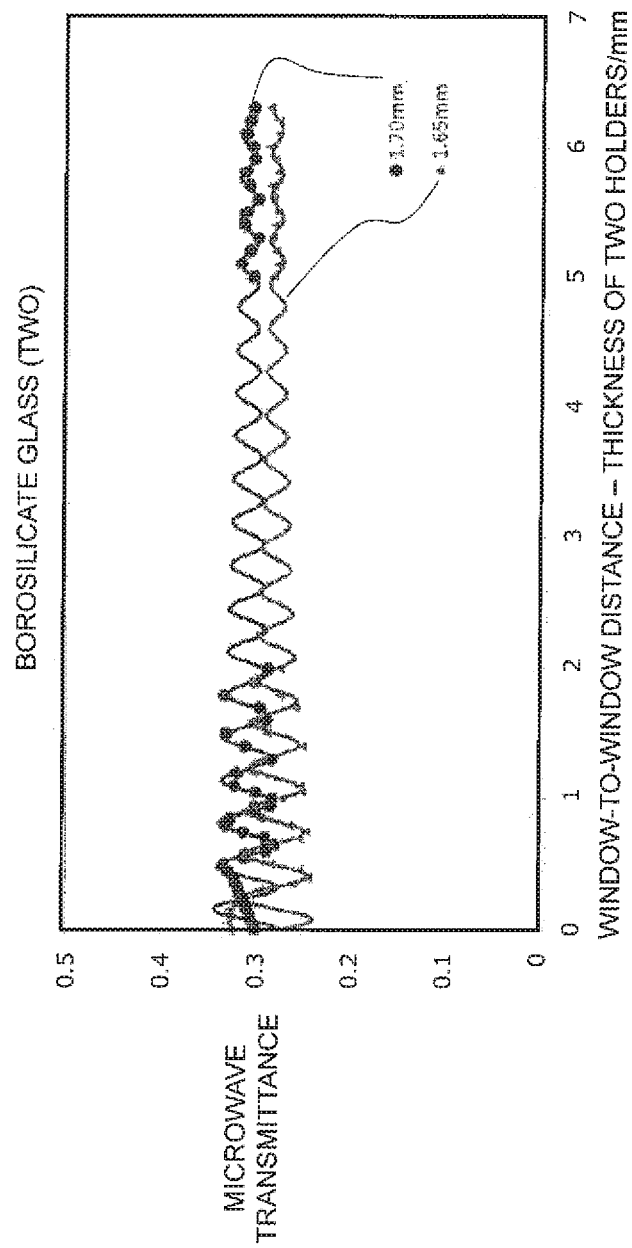
FIG. 7 is a relationship diagram between the window-to-window distance and the transmittance of two borosilicate glass windows.

FIG. 7 shows the microwave transmittances at a microwave frequency of 460 GHz when two borosilicate glass vacuum windows both had the window thickness of 1.65 mm and when two borosilicate glass vacuum windows both had the window thickness of 1.70 mm. When the window thickness of the vacuum windows was 1.65 mm, a window-to-window distance cycle of about 0.33 mm, a global maximum value in microwave transmittance of about 0.32, and a global minimum value in microwave transmittance of about 0.24 were obtained. In addition, for one borosilicate glass vacuum window having a window thickness of 1.65 mm, the transmittance was about 0.54 as shown in FIG. 6. For two borosilicate glass vacuum windows both having a window thickness of 1.65 mm, the convergence value was about 0.29. Therefore, the above two patterns (a) and (b) were observed.

When the window thickness of the borosilicate glass vacuum windows was 1.70 mm, a window-to-window distance cycle of about 0.33 mm, a global maximum value in microwave transmittance of about 0.35, and a global minimum value in microwave transmittance of about 0.28 were obtained. In addition, for one borosilicate glass vacuum window having a window thickness of 1.70 mm, the transmittance was about 0.56 as shown in FIG. 6. For two borosilicate glass vacuum windows both having a window thickness of 1.70 mm, the convergence value was about 0.31. Therefore, the above two patterns (a) and (b) were observed.

Figure 8:
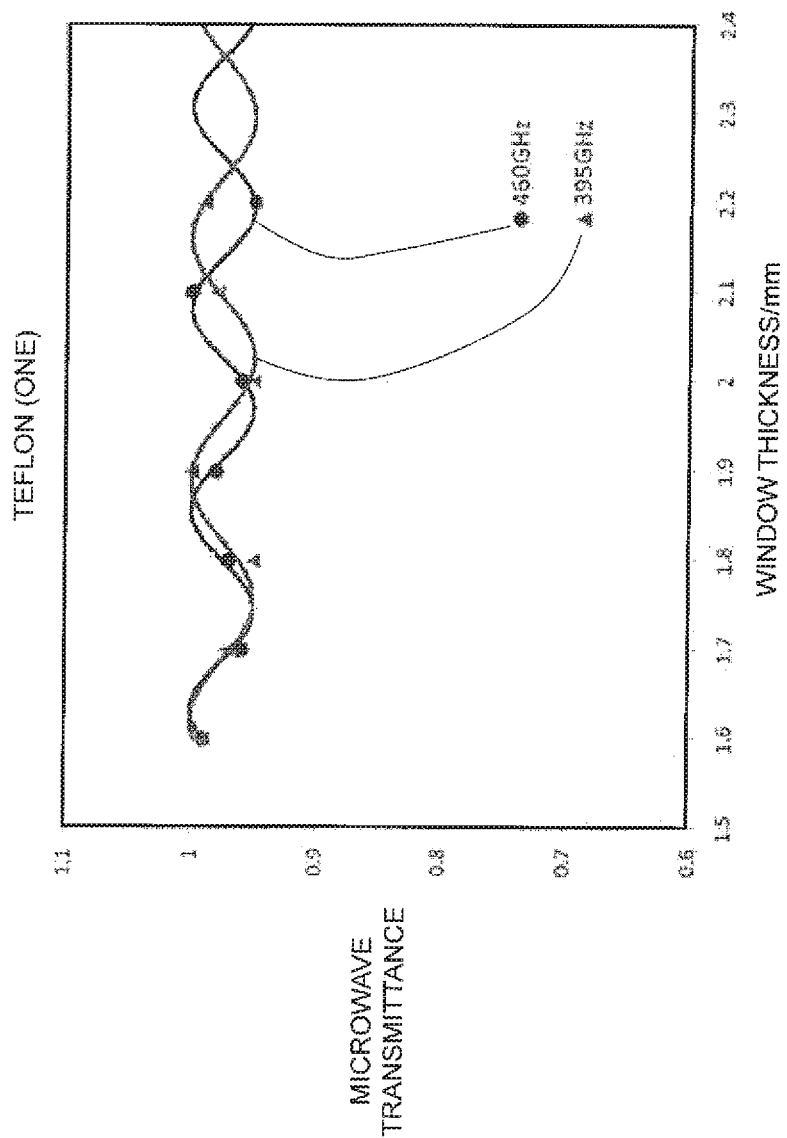
FIG. 8 is a diagram showing the relationship between the window thickness and the transmittance of one Teflon (registered trademark) window.

When one Teflon (registered trademark) vacuum window was used as shown in FIG. 8, and when the microwave frequency was 460 GHz, a window thickness cycle of about 0.23 mm, a global maximum value in microwave transmittance of about 1.0, and a global minimum value in microwave transmittance of about 0.95 were obtained. Further, when the microwave frequency was 395 GHz, a window thickness cycle of about 0.27 mm, a global maximum value in microwave transmittance of about 1.0, and a global minimum value in microwave transmittance of about 0.95 were obtained.

Figure 9:
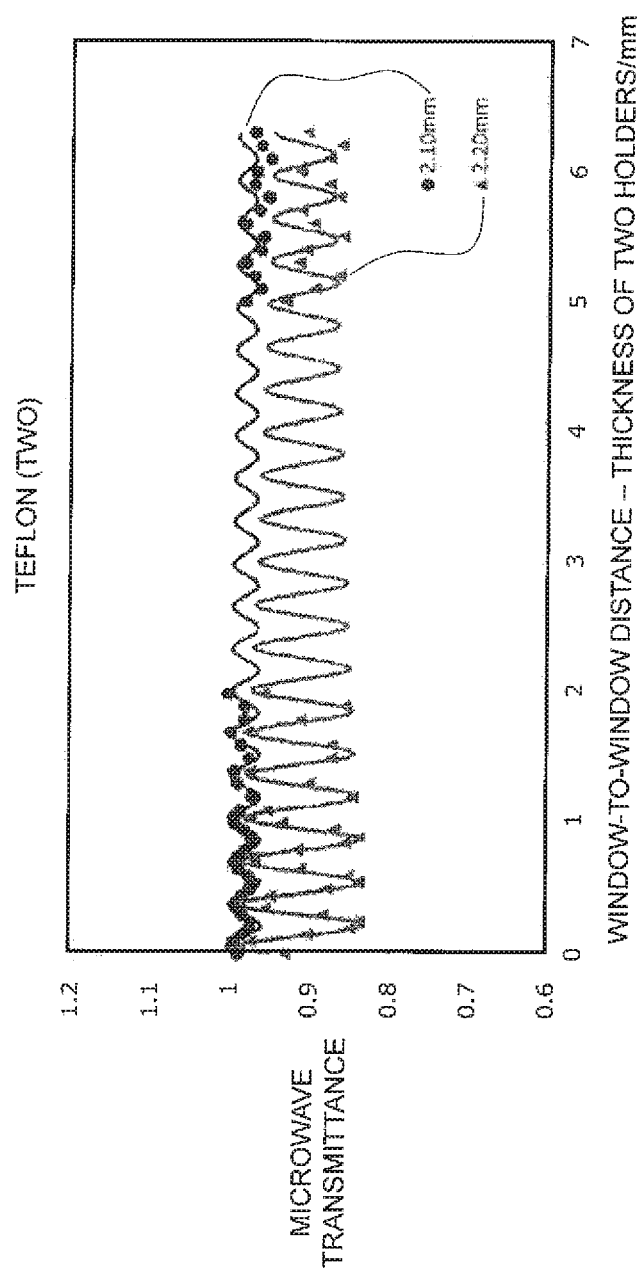
FIG. 9 is a relationship diagram between the window-to-window distance and the transmittance of two Teflon (registered trademark) windows.

FIG. 9 shows the microwave transmittances at a microwave frequency of 460 GHz when two Teflon (registered trademark) vacuum windows both had the window thickness of 2.20 mm and when two Teflon (registered trademark) vacuum windows both had the window thickness of 2.10 mm. When the window thickness of the vacuum window was 2.20 mm, a window-to-window distance cycle of about 0.33 mm, a global maximum value in microwave transmittance of about 1.0, and a global minimum value in microwave transmittance of about 0.82 were obtained. In addition, for one Teflon (registered trademark) vacuum window having a window thickness of 2.20 mm, the transmittance was about 0.95 as shown in FIG. 8. For two Teflon (registered trademark) vacuum windows both having a window thickness of 2.20 mm, the convergence value was about 0.90. Therefore, the above three patterns (a), (b), and (c) were observed.

When the window thickness of the Teflon (registered trademark) vacuum window was 2.10 mm, a window-to-window distance cycle of about 0.33 mm, a global maximum value in microwave transmittance of about 1.0, and a global minimum value in microwave transmittance of about 0.97 were obtained. In addition, for one Teflon (registered trademark) vacuum window having a window thickness of 2.10 mm, the transmittance was about 1.0 as shown in FIG. 8. For two Teflon (registered trademark) vacuum windows both having a window thickness of 2.10 mm, the convergence value was also estimated to be about 1.0. Therefore, the above two patterns (a) and (b) were observed. Further, it can be said that the above (c) was also observed if the errors in a transmittance of 1.0 are taken into account.

FIGS. 10 and 11 summarize the overview of the experimental results shown in FIGS. 2 to 9. FIG. 10 shows the microwave transmittances when one vacuum window was used, while FIG. 11 shows the microwave transmittances when two vacuum windows were used. The "index of refraction" included in FIG. 10 will be described later.

Figure 12:
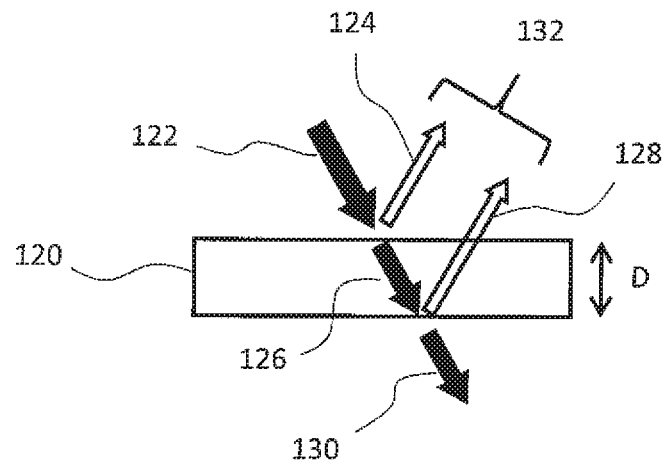
FIG. 12 is a schematic diagram illustrating microwave transmission through one window.

Here, the reason why the transmittance varies depending on the window thickness when one vacuum window is used will be considered with reference to FIG. 12. FIG. 12 is a schematic diagram showing microwaves entering a vacuum window 120. It should be noted that although FIG. 12 shows that microwaves enter the vacuum window orthogonally for convenience of explanation, they actually enter the vacuum window 120 vertically.

For incident waves indicated by an arrow 122, although most of the incident waves enter the inside of the vacuum window 120 as indicated by an arrow 126, a portion of them are reflected by the interface on the near side of the vacuum window 120 as indicated by an arrow 124. Further, for microwaves indicated by the arrow 126, although most of the microwaves become transmitted waves when they come out of the vacuum window 120 as indicated by an arrow 130, a portion of them are reflected by the interface on the back side of the vacuum window 120 as indicated by an arrow 128. Although most of the reflected waves indicated by the arrow 128 come out of the vacuum window 120, a portion of the reflected waves further cause multiple reflection. However, multiple reflection is not taken into account here, and only the major components in the figures will be considered.

As indicated by a reference numeral 132, the two reflected waves indicated by the arrows 124 and 128 interact with each other. Specifically, when the two reflected waves are in phase, they strengthen each other, and therefore, the reflection components are maximized, thereby minimizing the transmitted waves indicated by the arrow 130. That is, the transmittance is minimized. On the other hand, when the two reflected waves are in opposite phase, they cancel each other, and therefore, the reflection components are minimized, thereby maximizing the transmitted waves indicated by the arrow 130. That is, the transmittance is maximized.

Assuming that the window thickness of the vacuum window 120 is D, and that the wavelength of microwaves in the vacuum window 120 is $\lambda'$, D at which the transmittance is maximized can be indicated as follows by means of an integer i that is 0 or greater.

$$D = \left(\frac{i}{2} + \frac{1}{4}\right)\lambda' \quad (1)$$

When, in Expression (1), i is changed to i+1, and D is changed to D+$\Delta$D, a relational expression for D+$\Delta$D where the next highest transmittance is obtained after D, at which the transmittance is maximized, is obtained. The following expression is obtained from this relational expression and Expression (1).

$$2\Delta D = \lambda' \quad (2)$$

Expression (2) is an equation expressing the relationship between the window thickness cycles in FIGS. 2, 4, 6, and 8 and the wavelengths of microwaves (frequencies). Here, the velocity of light c, the wavelength of microwave in vacuum $\lambda_0$, and the microwave frequency v have the relationship of Expression (3).

$$c = \lambda_0 v \quad (3)$$

Further, when the index of refraction of the vacuum window 120 is n, the following Expression (4) holds.

$$\lambda' = \frac{\lambda_0}{n} \quad (4)$$

The table of FIG. 10 includes values of the indexes of refraction n obtained from the data in FIGS. 2, 4, 6, and 8 based on Expressions (2), (3), and (4). The indexes of refraction n are roughly estimated from the data and include errors. However, it can be confirmed that they are identical to the indexes of refraction of silicon nitride, alumina, borosilicate glass, and Teflon (registered trademark) used in the experiments within the range where the errors are taken into account. Therefore, it can be said that Expression (1) provides sufficiently reasonable results.

Expression (2) holds independently of materials of the vacuum window 120. It is therefore considered that the experimental result that the transmittance oscillates as the window thickness changes, which is shown in FIGS. 2, 4, 6, and 8, also holds true for other transmissive materials. Therefore, to increase transmission of the vacuum window 120, after the frequency of microwaves to be used and a material of the vacuum window 120 to be used are determined, only the window thickness D of the vacuum window 120 needs to be determined to satisfy Expression (1). However, in reality, it is also possible to obtain the window thickness D at which the microwave transmittance exhibits a local maximum value through the experiments, in consideration of differences from the simple theory. The window thickness D indicating the thus obtained local maximum value is assumed to be $D_0$. The microwave transmittance changes in a sinusoidal manner according to change in window thickness D, and considering that the rate of change near the local maximum value is small, the window thickness D may be slightly deviated from $D_0$. It is therefore possible to set D, for example, within the range of the following Expression (5).

$$D_0 - \Delta D/8 \leq D \leq D_0 + \Delta D/8 \quad (5)$$

Alternatively, it is possible to set D within any one of the following ranges with further limitation.

$$D_0 - \Delta D/12 \leq D \leq D_0 + \Delta D/12 \quad (6)$$

$$D_0 - \Delta D/16 \leq D \leq D_0 + \Delta D/16 \quad (7)$$

$$D_0 - \Delta D/24 \leq D \leq D_0 + \Delta D/24 \quad (8)$$

$$D_0 - \Delta D/32 \leq D \leq D_0 + \Delta D/32 \quad (9)$$

Although the microwave transmittance is closer to the local maximum value as the setting range of D is narrower, it is necessary to increase the setting accuracy.

When a plurality of vacuum windows 120 are provided, it is considered that the transmittance can be increased by allowing each vacuum window 120 to satisfy the conditions described here. In this case, the plurality of vacuum windows 120 may have the same window thickness, or may have different window thicknesses.

Figure 13:
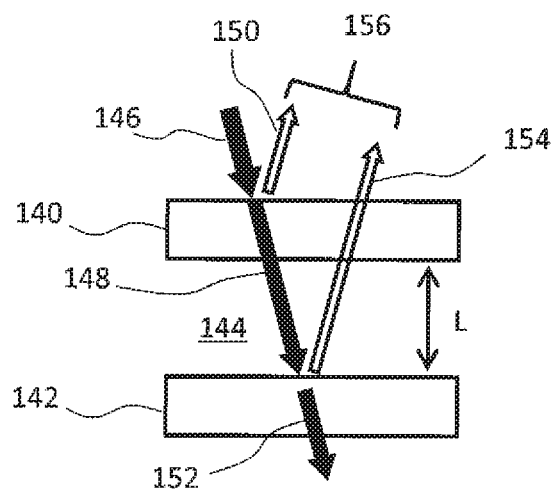
FIG. 13 is a schematic diagram illustrating microwave transmission through two windows.

Next, referring to FIG. 13, the reason why the transmittance varies according to the window-to-window distance when two vacuum windows are provided will be considered. FIG. 13 is a schematic view showing microwaves entering two vacuum windows 140 and 142 having a medium a 144 therebetween, from the vacuum window 140 side. It should be noted that although FIG. 13 shows that microwaves enter the vacuum window orthogonally for convenience of explanation, they actually enter the vacuum window 140 vertically.

For incident waves indicated by an arrow 146, although most of the incident waves enter the inside of the vacuum window 140 as indicated by an arrow 148, a portion of them are reflected by the interface on the near side of the vacuum window 140 as indicated by an arrow 150. Although a portion of the microwaves entering the inside of the vacuum window 140 are reflected on the interface on the back side of the vacuum window 140, its value is relatively small and is negligible here. It is therefore assumed that all the microwaves indicated by the arrow 148 entering the vacuum window 140 pass through the vacuum window 140 and propagate in the medium a. Although when the microwaves of the arrow 148 reach the interface on the near side of the next vacuum window 142, most of the microwaves are transmitted through the vacuum window 142 as indicated by an arrow 152, a portion of the microwaves are reflected as indicated by an arrow 154. The reflected waves are assumed to pass through the vacuum window 140 as they are without causing multiple reflection.

The conditions in which the intensity of microwaves indicated by the arrow 152 is maximized are considered to be the conditions in which the reflected waves indicated by the arrows 150 and 154 interact with each other and cancel each other as indicated by a reference numeral 156. Therefore, the following Expression (10) holds.

$$\frac{2D}{\lambda'} + \frac{2L}{\lambda''} = \left(j + \frac{1}{2}\right) \quad (10)$$

where L is the window-to-window distance between the vacuum windows 140 and 142, $\lambda''$ is the wavelength of microwaves in the medium a, D is the thickness of the vacuum window 140, and j is an integer that is 0 or greater. Expression (11) is derived from Expression (10) in a manner similar to that of Expression (2) derived from Expression (1).

$$2\Delta L = \lambda'' \quad (11)$$

where $\Delta L$ is a window-to-window distance cycle in which the transmittance is maximized. Expression (11) indicates that the window-to-window distance cycle $\Delta L$ in which the transmittance is maximized depends only on the wavelength of microwaves in the medium a.

According to Expression (3), the wavelength of microwaves of 460 GHz in vacuum is about 0.652 mm, and $\Delta L$ is about 0.326 mm. Meanwhile, as shown in FIG. 11, the window-to-window distance cycle was about 0.33 mm in all the cases in the experiments of FIGS. 3, 5, 7, and 9. The theory and the experimental results are very similar to each other.

Expression (11) holds independently of materials of the vacuum windows 140 and 142, and the transmittance oscillates with respect to the window-to-window distance between them with a cycle of $\Delta L$. Therefore, when the two vacuum windows 140 and 142 are used, the window thickness D of the vacuum windows 140 and 142 only needs to be determined to satisfy Expression (1) after the number of microwaves to be used and the medium a between the vacuum windows 140 and 142 are determined. However, in reality, it is also possible to obtain the window-to-window distance L in which the microwave transmittance exhibits a local maximum value through the experiments, in consideration of differences from the simple theory. The window-to-window distance L indicating the thus obtained local maximum value is assumed to be $L_0$. The microwave transmittance changes in a sinusoidal manner according to change in window-to-window distance L, and considering that the rate of change near the local maximum value is small, the window-to-window distance L may be slightly deviated from $L_0$. It is therefore possible to set L, for example, within the following range.

$$L_0 - \Delta L/8 \leq L \leq L_0 + \Delta L/8 \quad (12)$$

Alternatively, it is possible to set L within any one of the following ranges with further limitation.

$$L_0 - \Delta L/12 \leq L \leq L_0 + \Delta L/12 \quad (13)$$

$$L_0 - \Delta L/16 \leq L \leq L_0 + \Delta L/16 \quad (14)$$

$$L_0 - \Delta L/24 \leq L \leq L_0 + \Delta L/24 \quad (15)$$

$$L_0 - \Delta L/32 \leq L \leq L_0 + \Delta L/32 \quad (16)$$

As the setting range of L is narrower, the microwave transmittance is closer to the local maximum value. Particularly, in the case of (c) described above; that is, in order to obtain a high transmittance in which the microwave transmittance of the two vacuum windows 140 and 142 is greater than the product of the transmittances of one vacuum window, it is considered to be desirable to narrow the setting range of L and bring it closer to $L_0$. However, in order to bring the setting range of L closer to $L_0$, time and effort required for setting increase. The window-to-window distance L may be set by comparing and considering the advantages and disadvantages of such setting.

(B-4) Procedure for Changing Window-to-Window Distance

Figure 14:
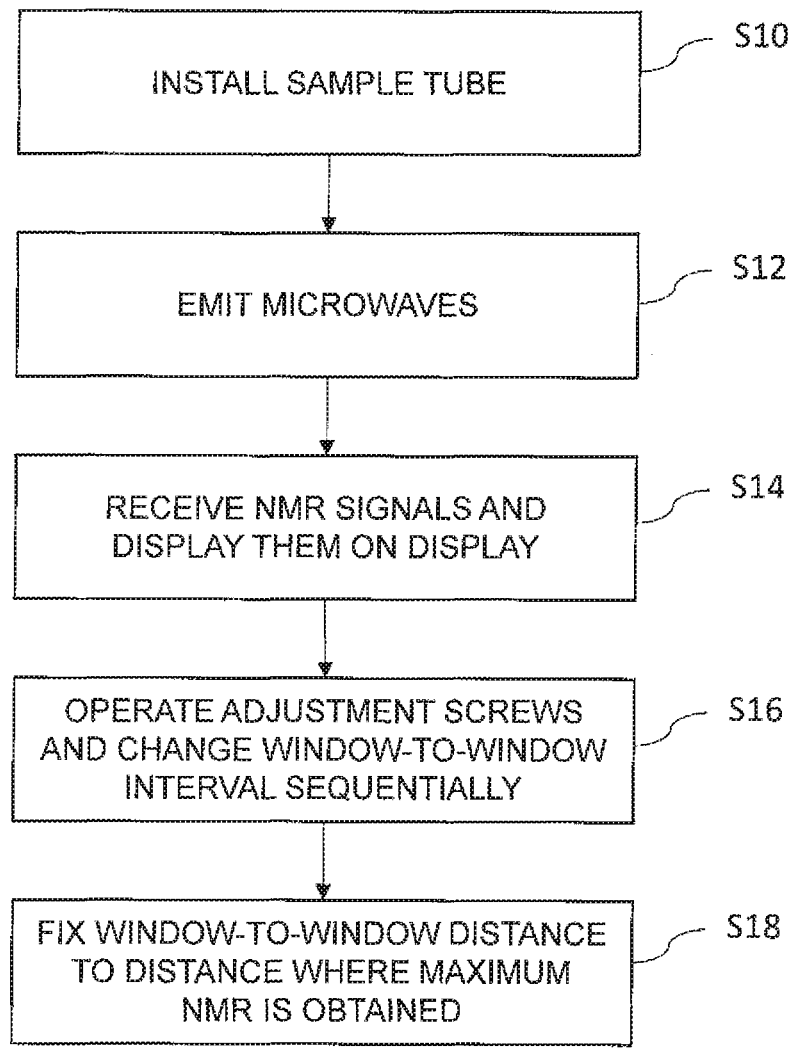
FIG. 14 is a flowchart showing an example of adjusting the window-to-window distance.

FIG. 14 is a flowchart showing an example of a procedure for manually adjusting the window-to-window distance between the vacuum windows 98 and 28 in the DNP-NMR probe 10 while actually checking NMR signals.

The user installs the sample tube (S10) and then prepares for measurements by carrying out predetermined operations, such as starting of cooling gas circulation as described above.

The user then starts emitting microwaves to carry out measurements according to the DNP method (S12). This excites electron spin resonance of radicals, thereby increasing the NMR signal intensity of the sample. The user operates the control PC and displays the received NMR signals on a display of the PC (S14). It is possible to understand change in NMR signal intensity (DNP efficiency) over time, for example, by displaying the signals using the horizontal axis as the time axis and the vertical axis as the NMR signal intensity.

In this situation, the user adjusts the four adjustment bolts 74 of the DNP-NMR probe 10. When microwaves of 460 GHz are emitted, adjustment is carried out sequentially at an interval of about 0.05 mm, for example. As described above, it is assumed that the transmittance of microwaves of 460 GHz changes with a cycle of about 0.33 mm. Therefore, by repeating a change of about 0.05 mm multiple times and causing, for example, a change of 0.4 mm in total, an approximate change in NMR signal intensity can be understood (S16).

Subsequently, the user fixes the window-to-window distance to a window-to-window distance that exhibits the greatest value in a series of adjustment processes (S18). At this stage, the resulting window-to-window distance may be adjusted by a smaller interval so as to be set at a window-to-window distance in which the microwave transmittance and the NMR signal intensity are further increased.

The DNP-NMR probe 10 may be affected by thermal shrinkage and thermal expansion caused by performing the measurements at an extremely low temperature. In particular, immediately after cooling by cooling gas is started, the DNP-NMR probe 10 itself is slightly heat shrunk, and the window-to-window distance between the vacuum windows 98 and 28 is changed. Therefore, adjustment needs to be made carefully.

Figure 15:
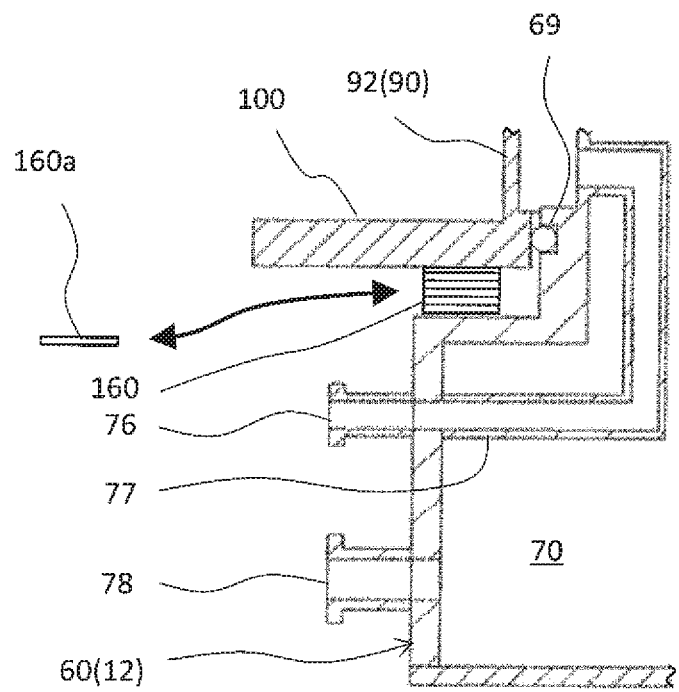
FIG. 15 is a diagram showing an example of a window-to-window distance adjustment mechanism by means of a spacer.

Referring now to FIG. 15, a variant of an adjustment aspect of the vacuum windows 98 and 28 in place of the adjustment bolts 74 will be described. FIG. 15 is a partial view showing only the vicinity of the lower left portion of the DNP-NMR probe 10 of FIG. 1. Parts that are the same as or correspond to those in FIG. 1 will be denoted by the same reference numerals, and the description thereof will be simplified.

In FIG. 15, the through holes 72, the adjustments bolts 74, and the bolt holes 102 shown in FIG. 1 are not provided. Instead, a spacer 160 adjusts the interval between the inner unit 12 including the lower unit 60 and the outer container 90 and thus the interval between the vacuum windows 98 and 28.

The spacer 160 is a stack of a plurality of individual thin spacers 160a. By inserting a sheet of spacer 160a into the spacer 160, the window-to-window distance can be increased by one sheet of spacer 160a. Further, by extracting a sheet of spacer 160a from the spacer 160, the window-to-window distance can be reduced by one sheet of spacer 160a. The thickness of the spacer 160a can adopt the interval width that is desired to be adjusted, and may be, for example, 0.05 mm, 0.03 mm, or 0.01 mm.

In the examples described above, the user manually adjusts the NMR signal intensity while actually looking at it. However, adjustment may be automated, for example, by causing adjustment by means of the adjustment bolts 74 or the spacer 160 to be performed mechanically. In addition, when the relationship between the window-to-window distance in which the NMR signal intensity is a global maximum (or a local maximum) and the adjustment screws is obtained in advance, it is possible to adjust the window-to-window distance without monitoring the NMR signal intensity.

In the above description, cooling gas having an extremely low temperature of 20 K or less is assumed to be used in the DNP-NMR probe 10. However, the embodiment is usable at a temperature higher than that. Cooling by means of cooling gas only needs to increase the NMR signal intensity even a little more than in the case where the DNP method is not used, and may provide cooling at a temperature of about 200 K or less, 150 K or less, or 10 K or less, for example. All of the temperatures can increase the microwave transmittance, thereby increasing the DNP efficiency and the NMR signal intensity.

The invention claimed is:

1. A DNP-NMR probe comprising:
   an inner container in which a sample to which a radical is added is installed;
   an outer container that stores the inner container therein and keeps a space between the outer container and the inner container in a vacuum state;
   an outer container waveguide that is a microwave waveguide provided on the outer container and has a vacuum window at an end on the inner container side; and
   an inner container waveguide that is a microwave waveguide provided on the inner container and has a vacuum window facing the vacuum window of the outer container waveguide through vacuum, the inner container waveguide guiding microwaves transmitted from the outer container waveguide to the sample,
   wherein at least one of a) a window thickness of the vacuum window of the outer container (Dout) and a window thickness of the vacuum window of the inner container (Din) or b) a window-to-window distance (L) of the vacuum window of the outer container and the vacuum window of the inner container is optimized for the transmittance of specific microwaves used.

2. The DNP-NMR probe according to claim 1, wherein the window-to-window distance (L) between the vacuum window of the outer container and the vacuum window of the inner container is set within the range of:

$$L_0 - \Delta L/8 \leq L \leq L_0 + \Delta L/8$$

for the specific microwaves used, where $L_0$ is a window-to-window distance at which a microwave transmittance exhibits a local maximum when the window-to-window distance (L) is changed, and $\Delta L$ is a distance that provides a cycle in which the microwave transmittance changes when the window-to-window distance (L) is changed.

3. The DNP-NMR probe according to claim 1, further comprising an adjustment mechanism that adjusts the window-to-window distance (L) between the vacuum window of the outer container and the vacuum window of the inner container.

4. The DNP-NMR probe according to claim 3, further comprising a moving mechanism that moves the inner container relative to the outer container, wherein
   the adjustment mechanism adjusts the window-to-window distance by adjusting the amount of movement of the moving mechanism.

5. The DNP-NMR probe according to claim 1, wherein the window thickness of the vacuum window of the outer container (Dout) and the window thickness of the vacuum window of the inner container (Din) are respectively set within the ranges of $$Dout_0 - \Delta Dout/8 \leq Dout \leq Dout_0 + \Delta Dout/8$$

$$Din_0 - \Delta Din/8 \leq Din \leq Din_0 + \Delta Din/8$$

for the specific microwaves used, where $Dout_0$ and $Din_0$ are window thicknesses at which the microwave transmittance exhibits a local maximum when the respective window thicknesses (Dout) and (Din) are changed, and $\Delta Dout$ and $\Delta Din$ are distances that provide a cycle in which the microwave transmittance changes when the respective window thicknesses (Dout) and (Din) are changed.

6. The DNP-NMR probe according to claim 1, wherein the vacuum window of the outer container and the vacuum window of the inner container are made of any one of ceramics, glass, single crystal, and resin materials.

7. A method of using a DNP-NMR probe, the DNP-NMR probe comprising:
- an inner container in which a sample to which a radical is added is installed;
- an outer container that stores the inner container therein and keeps a space between the outer container and the inner container in a vacuum state;
- an outer container waveguide that is a microwave waveguide provided on the outer container and has a vacuum window at an end on the inner container side;
- an inner container waveguide that is a microwave waveguide provided on the inner container and has a vacuum window facing the vacuum window of the outer container waveguide through vacuum, the inner container waveguide guiding microwaves transmitted from the outer container waveguide to the sample; and
- an adjustment mechanism that adjusts a window-to-window distance (L) between the vacuum window of the outer container and the vacuum window of the inner container, wherein
- the method comprises an optimizing step of optimizing the window-to-window distance for the microwave transmittance of specific microwaves used, by means of the adjustment mechanism.

8. The method according to claim 7, wherein the optimizing step is a step of setting the window-to-window distance (L) within the range of $$L_0 - \Delta L/8 \leq L \leq L_0 + \Delta L/8$$

for microwaves of a specific frequency used, where $L_0$ is a window-to-window distance in which the microwave transmittance exhibits a local maximum when the window-to-window distance (L) is changed, and $\Delta L$ is a distance that provides a cycle in which the microwave transmittance changes when the window-to-window distance (L) is changed.

* * * * *